(12) United States Patent
Yoshida

(10) Patent No.: US 12,034,069 B2
(45) Date of Patent: Jul. 9, 2024

(54) METHOD OF MANUFACTURING SEMICONDUCTOR DEVICE AND SEMICONDUCTOR DEVICE

(71) Applicant: SUMITOMO ELECTRIC INDUSTRIES, LTD., Osaka (JP)

(72) Inventor: Shigeki Yoshida, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/063,361

(22) Filed: Dec. 8, 2022

(65) Prior Publication Data

US 2023/0105888 A1  Apr. 6, 2023

Related U.S. Application Data

(62) Division of application No. 16/953,920, filed on Nov. 20, 2020, now abandoned.

(30) Foreign Application Priority Data

Nov. 25, 2019 (JP) .................. 2019-212427

(51) Int. Cl.
*H01L 29/778* (2006.01)
*H01L 29/20* (2006.01)
(Continued)

(52) U.S. Cl.
CPC ...... *H01L 29/7783* (2013.01); *H01L 29/2003* (2013.01); *H01L 29/205* (2013.01); *H01L 29/66462* (2013.01)

(58) Field of Classification Search
CPC . H01L 23/28; H01L 23/3171; H01L 23/3192; H01L 29/122–127;
(Continued)

(56) References Cited

U.S. PATENT DOCUMENTS

2008/0128753 A1  6/2008 Parikh
2012/0187452 A1  7/2012 Saito et al.
(Continued)

FOREIGN PATENT DOCUMENTS

| JP | 2003-101149 | 4/2003 |
|----|-------------|--------|
| JP | 2007/281527 | 10/2007 |
| JP | 2012/156332 | 8/2012 |

OTHER PUBLICATIONS

CA Office action dated Jan. 5, 2023 for (parent) U.S. Appl. No. 16/953,920.

*Primary Examiner* — Natalia A Gondarenko
(74) *Attorney, Agent, or Firm* — SMITH, GAMRELL & RUSSELL, LLP

(57) ABSTRACT

A method of manufacturing a semiconductor device comprises steps of: forming a semiconductor stack by growing an AlGaN layer or an InAlN layer, an AlN layer, and a GaN layer on a substrate in this order; forming a recess in the semiconductor stack by a dry etching from a surface of the semiconductor stack, the surface being opposite to the substrate; growing a GaN region in the recess; and forming an ohmic electrode on the GaN region; wherein in the forming of the recess, the dry etching is stopped in response to the recess reaching the AlN layer.

3 Claims, 6 Drawing Sheets

(51) Int. Cl.
   *H01L 29/205*   (2006.01)
   *H01L 29/66*   (2006.01)

(58) Field of Classification Search
   CPC ....... H01L 29/15–158; H01L 29/42316; H01L
       29/6656; H01L 29/66431; H01L
       29/66462; H01L 29/6653; H01L
       29/66719; H01L 29/778–7789; H01L
       29/7816; H01L 29/808; H01L 21/02183;
       H01L 21/02164; H01L 21/0228; H01L
       21/02274; H01L 21/02107; H01L
       21/02112; H01L 21/022; H01L 21/02208;
       H01L 21/02205; H01L 21/02225; H01L
       21/0229; H01L 21/2123; H01L 21/0217;
       H01L 21/28114; H01L 2924/13064; H01L
       21/02458; H01L 21/02488; H01L
       21/02505; H01L 21/0254; H01L 21/0262;
       H01L 29/7783; H01L 29/2003; H01L
       29/205; H01L 29/0847; H01L 29/7786;
       H01L 29/7781; H01L 29/401; H01L
       29/41725; H01L 29/452; H01L 29/7787;
       H01L 21/823468; H01L 21/823864;
       H01L 21/823456; H01L 21/82385
   See application file for complete search history.

(56) References Cited

U.S. PATENT DOCUMENTS

| | | |
|---|---|---|
| 2014/0045306 A1 | 2/2014 | Bour |
| 2014/0264379 A1 | 9/2014 | Kub et al. |
| 2014/0264380 A1* | 9/2014 | Kub .................... H01L 29/7787 257/77 |
| 2017/0125567 A1 | 5/2017 | Yamada |
| 2018/0047840 A1 | 2/2018 | Nakamura |
| 2019/0206998 A1* | 7/2019 | Huang .............. H01L 29/66446 |
| 2020/0273974 A1* | 8/2020 | Guidry ................ H01L 29/7786 |
| 2021/0384339 A1 | 12/2021 | Sun |

* cited by examiner

METHOD OF MANUFACTURING SEMICONDUCTOR DEVICE AND SEMICONDUCTOR DEVICE

CROSS REFERENCE TO RELATED APPLICATIONS

This application is a division of U.S. application Ser. No. 16/953,920 filed on Nov. 20, 2020, which application claims the benefit of priority from Japanese Patent Application No. 2019-212427 filed on Nov. 25, 2019, the entire contents of which are incorporated herein by reference.

BACKGROUND

The present disclosure relates to a method of manufacturing a semiconductor device and a semiconductor device.

US2014/0045306A1 discloses a method for manufacturing a nitride semiconductor device. In this manufacturing method, the n-type nitride layer and the p-type nitride layer are grown sequentially on the nitride substrate. Then, an AlN mask is formed on the p-type nitride layer. A cavity reaching the n-type nitride layer is formed by etching these nitride layers under a hydrogen atmosphere through the opening of the AlN mask. Thereafter, a nitride material is grown in the cavity, and an electrode is formed on the nitride material.

JP2003-101149A discloses a method of manufacturing a semiconductor device. In this manufacturing method, a semiconductor stack comprising a GaN buffer layer, a Mg-doped GaN layer, an AlGaN layer, and an n-type GaN contact layer is grown on a sapphire substrate. Thereafter, a laminate is formed by bonding a polycrystalline diamond substrate on the semiconductor stack. Thereafter, the laminate is set into a heat treatment furnace and separated at the position of the Mg-doped GaN layer by etching under a hydrogen atmosphere.

SUMMARY

The present disclosure provides a method of manufacturing a semiconductor device. The method of manufacturing a semiconductor device, comprising steps of: forming a semiconductor stack by growing an AlGaN layer or an InAlN layer, an AlN layer, and a GaN layer on a substrate in this order; forming a recess in the semiconductor stack by dry etching the semiconductor stack from a surface thereof which is opposite to the substrate; growing a GaN region in the recess; and forming an ohmic electrode on the GaN region. In the forming of the recess, the dry etching is stopped in response to the recess reaching the AlN layer.

The present disclosure provides a first semiconductor device. The first semiconductor device comprising: a substrate; an AlGaN layer or an InAlN layer provided on the substrate; an AlN layer provided on the AlGaN layer or the InAlN layer; an GaN layer provided on the AlN layer; a pair of GaN regions which is provided on the AlN layer, sandwiches a portion of the GaN layer and is formed on a surface of the AlN layer; a pair of ohmic electrodes which is provided on the pair of GaN regions and makes ohmic contacts with each of the pair of GaN regions; and a gate electrode provided between the pair of ohmic electrodes on the GaN layer.

The present disclosure provides a second semiconductor device. The second semiconductor device comprising: a substrate; a barrier layer provided on the substrate; a stopper layer provided on the barrier layer; a channel layer provided on the stopper layer; a source region and a drain region which are adjacent to the channel layer, sandwich a portion of the channel layer; a source electrode and a drain electrode respectively provided on the source region and the drain region; and a gate electrode provided between the source electrode and the drain electrode. The barrier layer is an AlGaN layer or an InAlN layer. The stopper layer is an AlN layer. The channel layer is a GaN layer. The source region and the drain region are GaN regions. The channel layer and the source region and the drain region is formed on a surface of the stopper layer.

DETAILED DESCRIPTION

Figure 1:
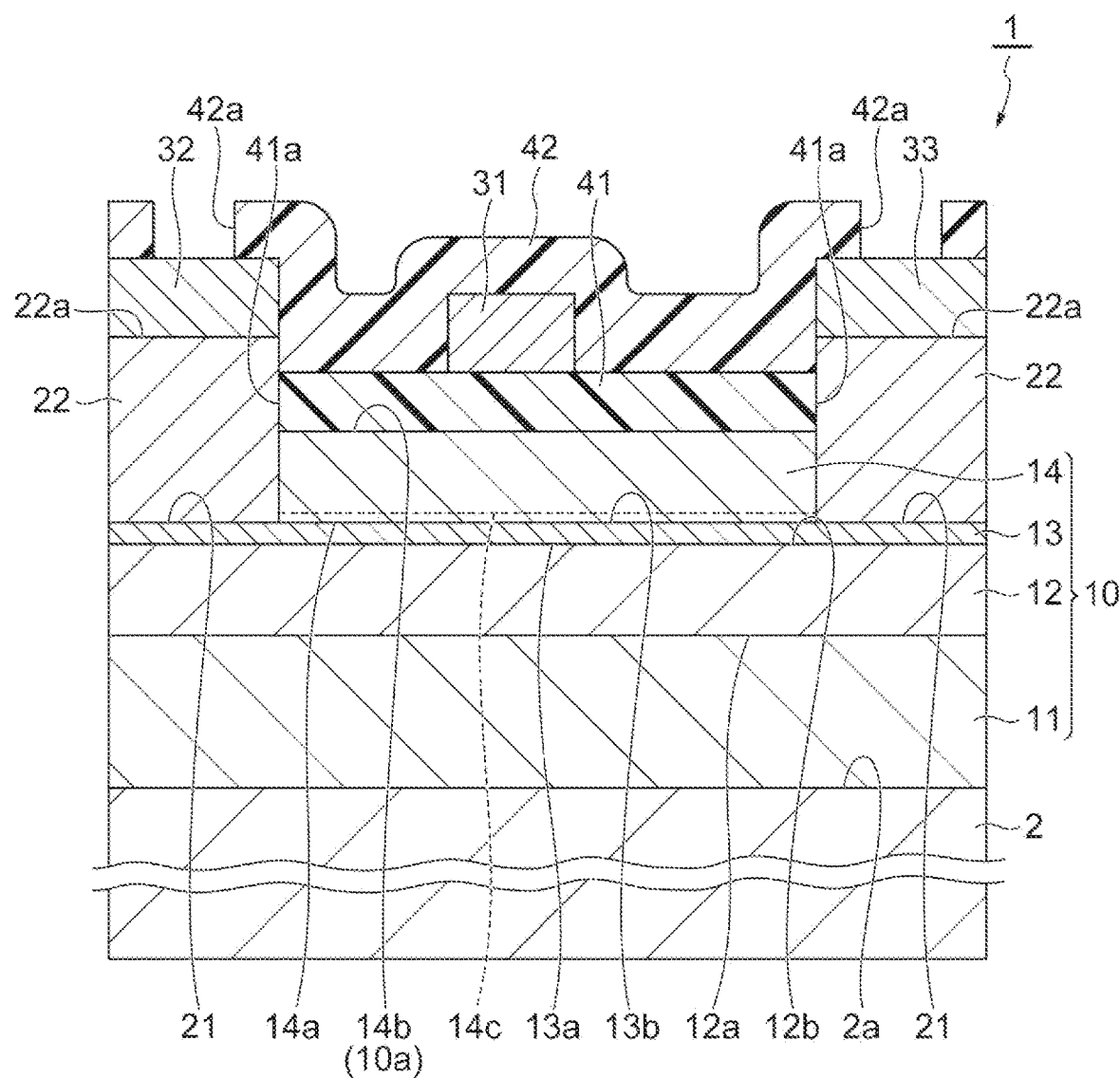
FIG. 1 is a cross-sectional view illustrating a configuration of a high mobility transistor (HEMT) as an exemplary semiconductor device.

In conventional semiconductor devices, there is a case embedding a selectively regrown a nitride semiconductor region to a recess after forming the recess in the nitride semiconductor stack. For example, in a high electron mobility transistor (HEMT) using a nitride semiconductor, a nitride semiconductor stack including a GaN channel layer (electron supplying layer) and a AlGaN barrier layer provided on the GaN channel layer is formed. Then a recess reaching the GaN channel layer is formed in the nitride semiconductor stack. After that, a high-concentration nitride semiconductor region (e.g., n-type GaN region) may be grown in the recess, and an ohmic electrode (source electrode or drain electrode) may be formed on the region. In such a HEMT, since the nitride semiconductor region is in direct contact with a channel region occurring near the interface between the GaN channel layer and AlGaN barrier layer, it is possible to reduce the access resistance between the ohmic electrode and the channel region through the nitride semiconductor region.

For example, reactive ion etching (RIE) using a chlorine-based gas is used for forming the recess described above. However, the selectivity for etching between the GaN channel layer and AlGaN barrier layer by chlorine plasma is not sufficient, the variation in the etching depth (depth of the recess) is likely to occur. When the etching depth varies in this manner, the access resistance between the ohmic electrode and the channel region varies.

According to a semiconductor device and a manufacturing method of a semiconductor device of the present disclosure, it is possible to reduce variations in the access resistance between the ohmic electrode and the channel region.

Specific examples of a method of manufacturing a semiconductor device and a semiconductor device of the present disclosure are described below with reference to the drawings. It should be noted that the present disclosure is not limited to these examples, but is indicated by the claims, and it is intended to include all modifications within the meaning and range equivalent to the claims. In the following description, in the description of the drawings, the same elements are denoted by the same reference numerals, and a repetitive description is omitted.

FIG. 1, as an exemplary semiconductor device according to the present embodiment, is a cross-sectional view showing the configuration of a high mobility transistor (HEMT) 1. The HEMT 1 is structured as a so-called inverted HEMT. Specifically, the HEMT 1 includes a substrate 2, a semiconductor stack 10, a gate electrode 31, a source electrode 32, a drain electrode 33, an SiN layer 41, and an insulating layer 42. The semiconductor stack 10 is provided on the substrate 2. The gate electrode 31, the source electrode 32, and the drain electrode 33 are provided on the semiconductor stack 10. The SiN layer 41 is provided between the gate electrode 31 and the semiconductor stack 10. The insulating layer 42 is provided on the SiN layer 41 and covers the gate electrode 31. As an application of the inverted HEMT, use at a high frequency, such as for E-band or W-band, is conceivable. In particular, E-band is expected to be applied to communication between mobile phones.

The substrate 2 is, for example, a substrate for growth of a GaN-based semiconductor, in one example, a semi-insulating SiC substrate. When the substrate 2 is an SiC substrate, a surface 2a of the substrate 2 is a carbon face (C-face). When the surface 2a of the substrate 2 is the C-face, the semiconductor stack 10 can epitaxially grow as nitrogen polar (N-polar) GaN. The substrate 2 may not be a substrate for epitaxial growth. In that case, the semiconductor stack 10 may grow on another substrate, the substrate may be removed from the semiconductor stack 10, and the semiconductor stack 10 may be bonded to the substrate 2. In that case, semi-insulating substrates of various materials can be used as the substrate 2, for example, an Si substrate, an SiC substrate, an AlN substrate, a sintered body or the like may be used.

The semiconductor stack 10 is mainly composed of a nitride semiconductor (especially GaN-based semiconductor). For example, the semiconductor stack 10 includes a buffer layer 11, an AlGaN barrier layer 12 (or an InAlN barrier layer), an AlN layer 13, and a GaN channel layer 14 which are provided in this order from the substrate 2 side. The buffer layer 11 is a layer epitaxially grown on the substrate 2, for example, a GaN layer. The buffer layer 11 epitaxially grows as N-polar GaN on C-face SiC. Therefore, the surface of the buffer layer 11 opposite to the substrate 2 becomes a Nitrogen face (N-face), and the back surface of the buffer layer 11 on the substrate 2 side becomes a gallium face (Ga-face). The thickness of the buffer layer 11 is, for example, in the range of 300 nm or more and 1000 nm or less, and is 500 nm in one embodiment. When the buffer layer 11 is bonded to the substrate 2 after the buffer layer 11 is grown on another substrate and the substrate is removed, the buffer layer 11 may be omitted.

The AlGaN barrier layer 12 is an AlGaN layer epitaxially grown on the buffer layer 11, and functions as a barrier layer (electron-supplying layer). The band gap of the AlGaN barrier layer 12 is larger than the band gap of the GaN channel layer 14 described later. The AlGaN barrier layer 12 has a back surface 12a in contact with the buffer layer 11, and the back surface 12a is a Ga-face. Further, the AlGaN barrier layer 12 has a surface 12b opposite to the buffer layer 11 (i.e., opposite to the substrate 2), the surface 12b is an N-face. The thickness of the AlGaN barrier layer 12 is, for example, 20 nm or more and 40 nm or less, and 30 nm in one embodiment. When the AlGaN barrier layer 12 is an $Al_xGa_{1-x}N$ barrier layer, the Al composition x is, for example, 0.15 or more and 0.35 or less, and in one embodiment, the Al composition x is 0.25. The conductivity type of the AlGaN barrier layer 12 is, for example, n-type or undoped (i-type). Instead of the AlGaN barrier layer 12, an InAlN barrier layer may be disposed.

The AlN layer 13 is a layer epitaxially grown on the AlGaN barrier layer 12, and is provided between the AlGaN barrier layer 12 and the GaN channel layer 14. The AlN layer 13 functions as an etching stop layer for the GaN channel layer 14 when the semiconductor stack 10 is etched. That is, the AlN layer 13 has higher etching resistance than the GaN channel layer 14. The AlN layer 13 has a back surface 13a in contact with the front surface 12b of the AlGaN barrier layer 12, and the back surface 13a is a Ga-face. Further, the AlN layer 13 has a surface 13b opposite to the AlGaN barrier layer 12 (i.e., opposite to the substrate 2), and the surface 13b is an N-face. The thickness of the AlN layer 13 is, for example, in the range of 0.3 nm or more and 2.0 nm or less, and is 0.5 nm in one embodiment.

The GaN channel layer 14 is provided on the AlGaN barrier layer 12 through the AlN layer 13. The GaN channel layer 14 is a GaN layer epitaxially grown on the AlN layer 13, and functions as a channel layer. The band gap of the GaN channel layer 14 is smaller than the band gap of the AlGaN barrier layer 12. The GaN channel layer 14 has a back surface 14a in contact with the surface 13b of the AlN layer 13, and the back surface 14a is a Ga-face. Further, GaN channel layer 14 has a surface 14b opposite to the AlGaN barrier layer 12 (i.e., opposite to the substrate 2), and the surface 14b is an N-face. The surface 14b is a surface 10a opposite to the substrate 2 in the semiconductor stack 10. The thickness of the GaN channel layer 14 is, for example, in the range of 5 nm or more and 15 nm or less, and is 9 nm in one embodiment. A strain occurs between the GaN channel layer 14 and the AlGaN barrier layer 12 due to the difference in their lattice constants, and this strain induces piezoelectric charges at an interface between the GaN channel layer 14 and the AlGaN barrier layer 12. Thus, two-dimensional electron gas (2DEG) is generated in a region of the GaN channel layer 14 on the AlGaN barrier layer 12 side, and a channel region 14c is formed. The conductivity type of the GaN channel layer 14 is, for example, n-type or undoped (i-type).

HEMT 1 further comprises a pair of GaN regions 22 (source and drain regions). The pair of GaN regions 22 are embedded in the semiconductor stack 10 and are provided side by side in one direction along the surface 2a of the substrate 2. Specifically, each GaN region 22 is provided on the surface 13b of the AlN layer 13, and is provided side by side at a position sandwiching a portion of the GaN channel layer 14 in the one direction. The pair of GaN regions 22 embed a pair of recesses 21 (concave portions) formed in the semiconductor stack 10. The pair of recesses 21 reach the surface 13b of the AlN layer 13 through the GaN channel layer 14 from the surface 10a of the semiconductor stack 10 (i.e., the surface 14b of the GaN channel layer 14). Therefore, the bottom surface of each recess 21 reaches the surface 13b. Each GaN regions 22 embedded in each recess 21 is in contact with the surface 13b and in contact with the channel region 14c in the GaN channel layer 14. Each recess 21 is formed by etching the semiconductor stack 10.

The GaN regions 22 are regions epitaxially grown on the surface 13b of the AlN layer 13. The GaN regions 22 are provided for reducing the resistance value between the channel region 14c and the source electrode 32, or the resistance value between the channel region 14c and the drain electrode 33. The GaN regions 22 are n-type GaN layers doped to a high concentration within a range of, for example, $1\times10^{18}$ cm$^{-3}$ or more and $1\times10^{20}$ cm$^{-3}$ or less. The impurity concentration of the GaN regions 22 are higher than each of the impurity concentration of the GaN channel layer 14 and the impurity concentration of the AlGaN barrier layer 12. Each GaN region 22 has a surface 22a opposite to the AlN layer 13 (i.e., opposite to the substrate 2). The surfaces 22a are provided at a position higher than the surface 10a of the semiconductor stack 10 with reference to the surface 2a of the substrate 2. That is, the GaN regions 22 are thicker than the GaN channel layer 14 and protrudes from the surface 14b of the GaN channel layer 14.

The source electrode 32 is provided on the surface 22a of one of the GaN regions 22 (source region). The drain electrode 33 is provided on the surface 22a of the other GaN region 22 (drain region). The source electrode 32 makes an ohmic contact with one GaN region 22. The drain electrode 33 makes an ohmic contact with the other GaN region 22. The source electrode 32 and the drain electrode 33 serving as ohmic electrodes are formed by alloying, for example, a laminated structure of a Ti (titanium) layer and an Al (aluminum) layer, or a Ta (tantalum) layer and an Al (aluminum) layer. The source electrode 32 and the drain electrode 33 may be alloyed after another Ti layer (or another Ta layer) is further laminated on the Al layer.

The SiN layer 41 is provided on the surface 10a of the semiconductor stack 10. The SiN layer 41 is in contact with the surface 10a and covers the surface 10a. The SiN layer 41 has a pair of openings 41a. Each opening 41a corresponds to each recess 21. Each GaN region 22 is provided in each opening 41a. In this embodiment, with reference to the surface 2a of the substrate 2, the surface 22a of each GaN region 22 is higher than the surface of the SiN layer 41 opposite to the substrate 2, and each GaN region 22 protrudes from the surface of the SiN layer 41.

The gate electrode 31 is provided on the surface 10a of the semiconductor stack 10 via the SiN layer 41, and is disposed between the source electrode 32 and the drain electrode 33 in one direction along the surface 2a of the substrate 2. The gate electrode 31 has, for example, a stacked structure of a Ni (nickel) layer, a Pd (palladium) layer, and an Au (gold) layer. The SiN layer 41 may have an opening at the position of the gate electrode 31, and the gate electrode 31 may be in contact with the surface 10a through the opening.

The insulating layer 42 is a protective layer covering the gate electrode 31 and the semiconductor stack 10. The insulating layer 42 is made of an insulating material including Si, and is, in one example, an SiN layer, an SiO$_2$ layer, or an SiON layer. The insulating layer 42 has a pair of openings 42a. The source electrode 32 is exposed from one of the openings 42a, and the drain electrode 33 is exposed from the other opening 42a. A wiring connected to the source electrode 32 is provided in one of the openings 42a, and a wiring connected to the drain electrode 33 is provided in the other opening 42a.

Figure 2A:
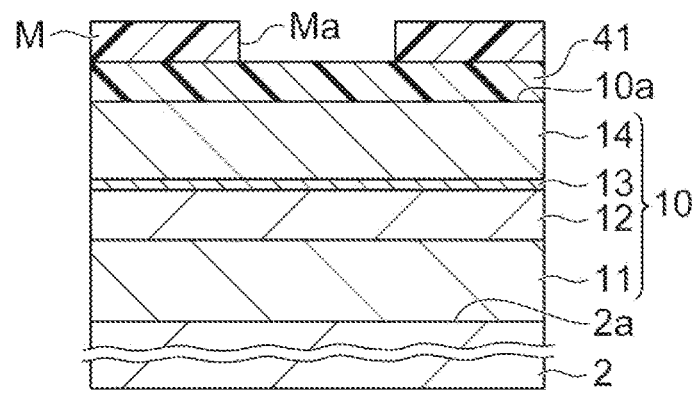
FIGS. 2A, 2B, 2C, and 2D are cross-sectional views showing respective manufacturing steps of the HEMT shown in FIG. 1.

Subsequently, an exemplary process for producing the HEMT 1 will be described with referring to FIGS. 2A, 2B, 2C and 2D. FIGS. 2A, 2B, 2C and 2D are cross-sectional views showing respective manufacturing steps of the HEMT 1. As shown in FIG. 2A, the semiconductor stack 10 is grown on the surface 2a of the substrate 2 by using, for example, a metal-organic vapor phase epitaxy (MOCVD) method. Specifically, first, the buffer layer 11 is grown on the surface 2a of the substrate 2. The source gases of the buffer layer 11 are, for example, TMGs (trimethylgallium) and NH$_3$ (ammonia). The growth temperature of the buffer layer 11 is, for example, 1050° C.

Next, the AlGaN barrier layer 12 is grown on the buffer layer 11. The source gases of the AlGaN barrier layer 12 are, for example, TMA (trimethylaluminum), TMG and NH$_3$. The AlGaN barrier 12 is grown, for example, at 1050° C. Next, the AlN layer 13 is grown on the AlGaN barrier layer 12. The source gases of the AlN layers 13 are, for example, TMAs and NH$_3$. The growth temperature of the AlN layer 13 is, for example, 1100° C. Next, a GaN channel layer 14 is grown on the AlN layer 13. The source gases of the GaN channel layers 14 are, for example, TMGs and NH$_3$. The growth temperature of the GaN channel layer 14 is, for example, 1050° C.

Subsequently, the SiN layer 41 in contact with the surface 10a of the semiconductor stack 10 is deposited using at least one of a low-pressure CVD method and a plasma CVD method. When the low-pressure CVD method is used, the film formation temperature is, for example, in the range of 600° C. or more and 850° C. or less, and the film formation pressure is, for example, in the range of 10 Pa or more and 50 Pa or less. The SiN layer 41 formed by the low-pressure CVD method becomes a dense and solid film as compared with the case of forming by the plasma CVD method. The source gases used in the formation by the low-pressure CVD method are, for example, NH$_3$ and SiH$_2$Cl$_2$ (dichlorosilane).

Figure 2B:
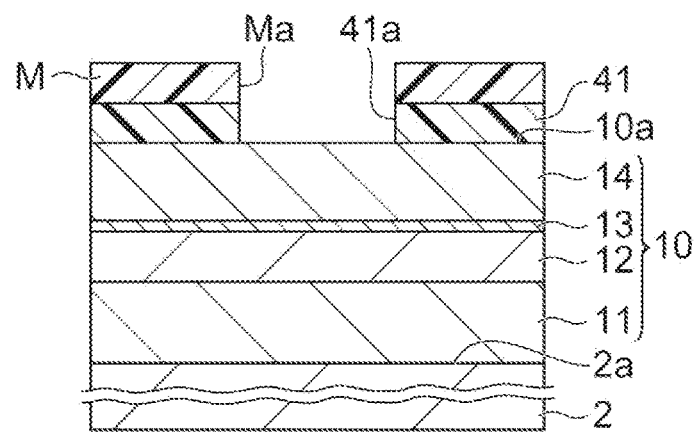

Subsequently, a mask M having an opening Ma is formed on the SiN layer 41. At this time, the openings Ma of the mask M are formed in regions corresponding to the pair of recesses 21 (see FIG. 1). Therefore, the planar shape of the openings Ma coincide with the planar shapes of the recesses 21. After the mask M is formed on the SiN layer 41, the SiN layer 41 is etched through the openings Ma of the mask M. The etching is, for example, reactive ion etching (RIE) using a fluorine-based gas. By this etching, as shown in FIG. 2B, the openings 41a for exposing the surface 10a of the semiconductor stack 10 is formed in the SiN layer 41.

Figure 2C:
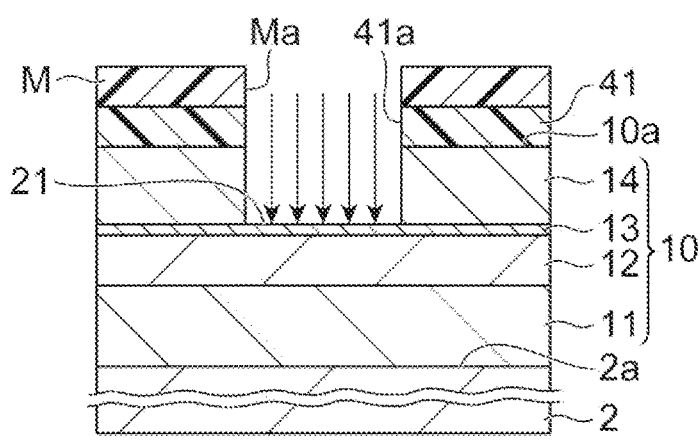

Subsequently, as shown in FIG. 2C, the recesses 21 are formed in the semiconductor stack 10 by etching through the openings Ma of the mask M. In this process, the semiconductor stack 10 is etched in a mixed atmosphere containing H$_2$ (hydrogen) and NH$_3$. The temperature of this mixed atmosphere is, for example, 900° C. or higher. The temperature of the mixed atmosphere may be within a range of, for example, 950° C. or higher and 1050° C. or less and in one embodiment, is 1000° C. When the temperature of the mixed atmosphere is 900° C. or higher, etching on the semiconductor stack 10 proceeds by H$_2$. The etching using such a mixed atmosphere can be performed not only in a furnace for etching, also in a growth furnace of the semiconductor stack 10 (e.g., an MOCVD furnace). In this process, the etching for the semiconductor stack 10 is performed in the growth furnace.

H$_2$ and NH$_3$ in the mixed atmosphere are supplied at a predetermined flow rate into the growth furnace in which etching is performed. When the flow rate of H$_2$ is F1 and the flow rate of NH$_3$ is F2, the ratio F2/F1 is, for example, in the range of 0.8 or more and 1.2 or less. Alternatively, the ratio F2/F1 may be in the range of 0.9 to 1.1. In one embodiment, the flow rate of $H_2$(F1) is 10910 sccm, the flow rate of $NH_3$ (F2) is 9090 sccm, and the ratio F2/F1 is 1.2.

$H_2$ has an etching selectivity between the AlN layer 13 and the GaN channel layer 14, and although the GaN channel layer 14 is sufficiently etched, etching of the AlN layer 13 is suppressed. That is, etching for the semiconductor stack 10 is stopped in response to reaching the surface 13b of the AlN layer 13. The rate of etching of the GaN channel layer 14 is, for example, 0.1 nm/sec. In this process, the GaN channel layer 14 exposed from the opening Ma is removed by etching with $H_2$. Thus, the recesses 21 reach the surface 13b of the AlN layer 13 through the GaN channel layer 14.

Figure 2D:
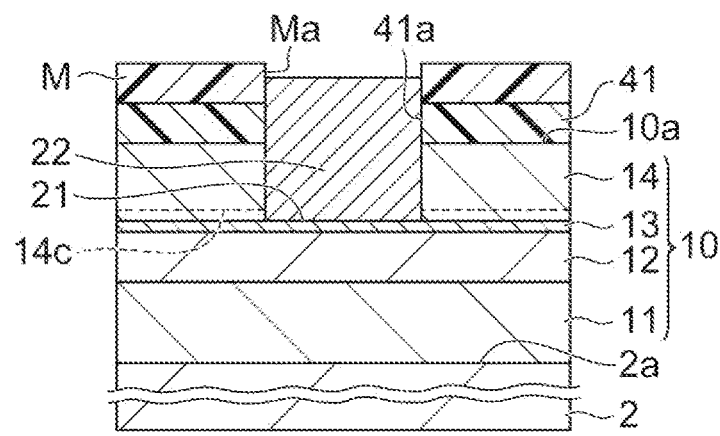

Subsequently, as shown in FIG. 2D, the GaN regions 22 are regrown in the recesses 21. In this process, the GaN regions 22 are continuously regrown in the growth furnace in which the etching for the recesses 21 are previously performed. Therefore, in the present embodiment, the process of forming the recesses 21 by etching and the process of regrowing the GaN regions 22 are performed continuously. That is, after forming the recesses 21 by etching, the GaN regions 22 are regrown in the recesses 21 without taking out the HEMT 1 from the growth furnace. In this process, the GaN regions 22 are epitaxially grown on the bottom surfaces of the recesses 21 (i.e., on the surface 13b of the AlN layer 13) by using methods, for example, such as sputtering, MOCVD, or molecular beam epitaxy (MBE). At this time, the atmosphere in the growth furnace is set to a temperature of, for example, 800° C. The n-type dopant is, for example, Si, and the dopant source is $SiH_4$ (silane).

Further, this process uses the same mask as the mask M which is used in the step of forming the recesses 21 by etching. Therefore, in this process, while the mask M on the SiN layer 41 is left, the GaN regions 22 are regrown in the recesses 21. At this time, the GaN regions 22 are deposited not only in the recesses 21 but also on the mask M around the recesses 21, and amorphous GaN (deposit) is formed on the mask M. Next, both of the mask M and the deposit formed on the mask M are removed using, for example, an alkaline etchant. The alkaline etchant may comprise, for example, NaOH (sodium hydroxide) or KOH (Potassium Hydroxide).

Subsequently, the source electrode 32 and the drain electrode 33 shown in FIG. 1 are formed on the surface 22a of each GaN region 22. In this process, first, a plurality of metal layers constituting the source electrode 32 and the drain electrode 33 (e.g., Ta/Al/Ta or Ti/Al/Ti) are deposited in order to form a laminated structure. Thereafter, the laminated structure is heat-treated and alloyed. The temperature of the heat treatment is, for example, in the range of 500° C. or more and 600° C. or less. Next, the gate electrode 31 is formed on the SiN layer 41 between the source electrode 32 and the drain electrode 33. In this process, a plurality of metal layers constituting the gate electrode 31 (e.g., Ni/Pa/Au) are deposited in order to form a laminated structure.

Subsequently, the insulating layer 42 is formed on the SiN layer 41 by, for example, a plasma CVD method, and the gate electrode 31 is covered with the insulating layer 42. Thereafter, the pair of openings 42a is formed in the insulating layer 42 by, for example, RIE using a fluorine-based gas, and the source electrode 32 and the drain electrode 33 are exposed from the respective openings 42a. Through the above steps, the HEMT 1 shown in FIG. 1 is manufactured. Thereafter, if necessary, a source wiring and drain wiring are formed on the source electrode 32 and the drain electrode 33, respectively.

Figure 3A:
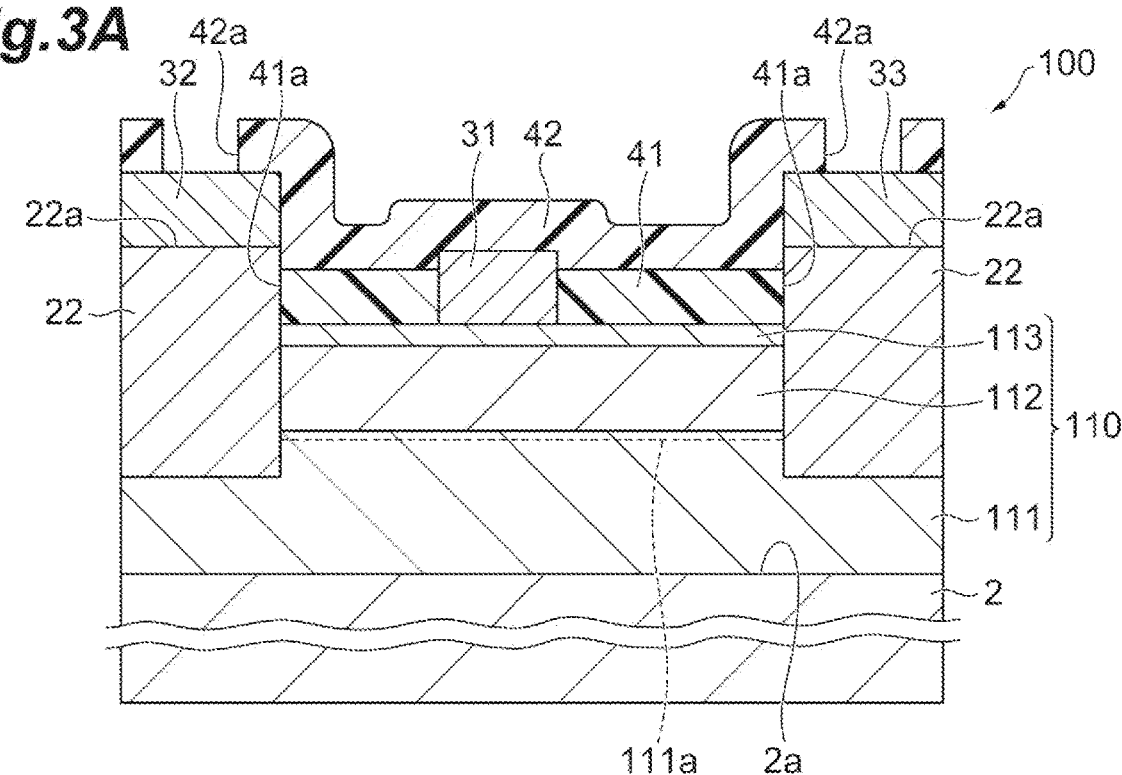
FIG. 3A is a cross-sectional view showing a configuration of a HEMT according to a first comparative embodiment.

The effects obtained by the HEMT 1 and the method of manufacturing the HEMT 1 according to the present embodiment having the above configuration are described together with the problems possessed by comparative examples. FIG. 3A is a cross-sectional view showing a configuration of a HEMT 100 according to a first comparative embodiment. Unlike the HEMT 1 according to the present embodiment, the HEMT 100 has a structure as a normal HEMT. That is, the HEMT 100 is provided with a semiconductor stack 110 in place of the semiconductor stack 10 of the HEMT 1 and the semiconductor stack 110 has a GaN channel layer 111, an AlGaN barrier layer 112, and a cap layer 113 on the surface 2a of the substrate 2 in this order. Thus, in the semiconductor stack 110, the GaN channel layer 111 is provided below the AlGaN barrier layer 112. Then, 2DEG is generated on the GaN channel layer 111 side in the vicinity of the interface between the GaN channel layer 111 and the AlGaN barrier layer 112, and the channel region 111a is formed.

Figure 3B:
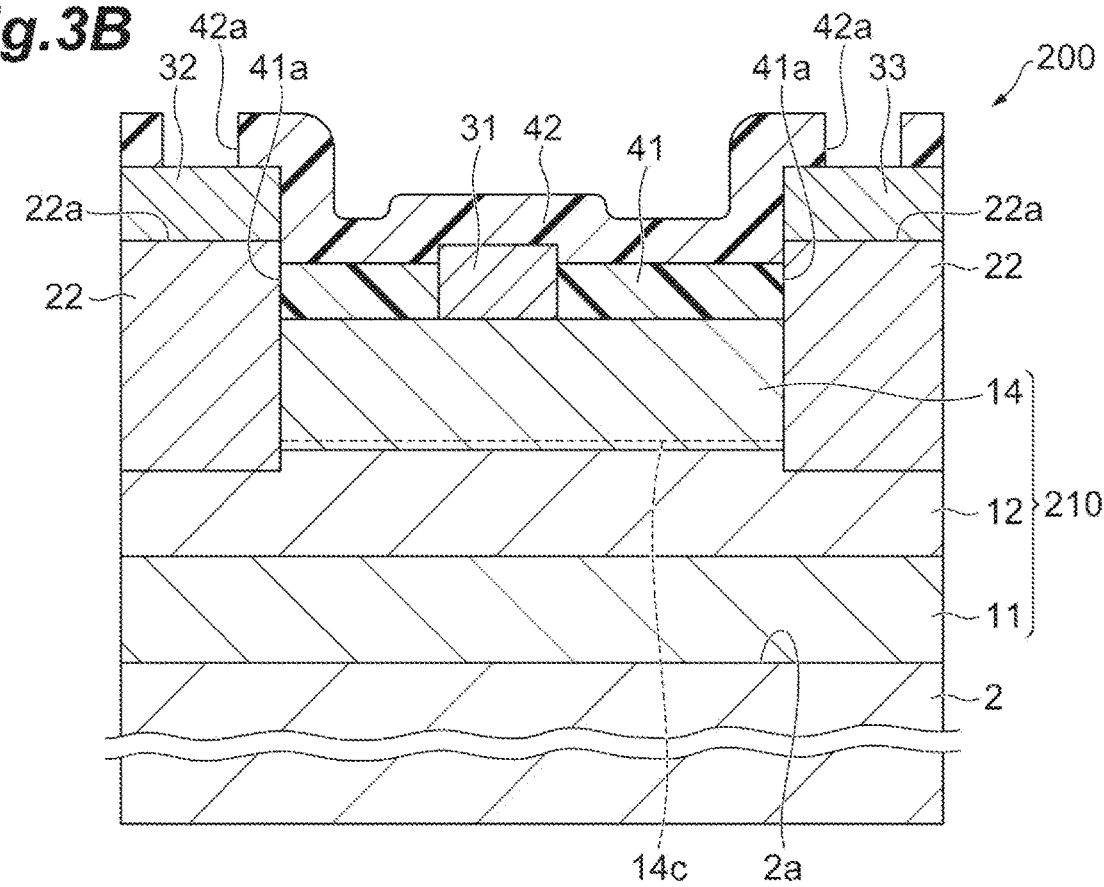
FIG. 3B is a cross-sectional view showing the configuration of a HEMT according to the second comparative embodiment.

FIG. 3B is a cross-sectional view showing the configuration of a HEMT 200 according to the second comparative embodiment. The HEMT 200 according to the second comparative example has a structure as the same inverted HEMT as the HEMT 1 according to the present embodiment. As shown in FIG. 3B, in the semiconductor stack 210 of the HEMT 200, the GaN channel layer 14 is provided on the AlGaN barrier layer 12, 2DEG occurs in the GaN channel layer 14 side in the vicinity of the interface between the GaN channel layer 14 and the AlGaN barrier layer 12, and the channel region 14c is formed. According to the HEMT 200 structure, it is possible to ensure the conductive path between the ohmic electrode (source electrode 32 or drain electrode 33) and the channel region 14c without passing through the AlGaN barrier layer 12, and it is possible to reduce the access resistance between each ohmic electrode and the channel region 14c.

Figure 4A:
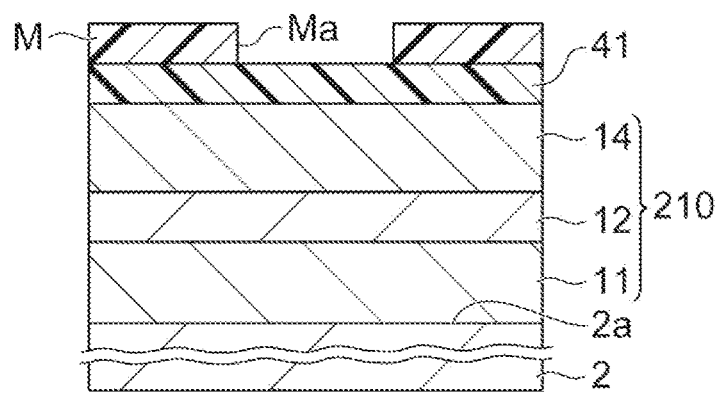
FIGS. 4A, 4B, 4C and 4D are cross-sectional views showing respective manufacturing steps of the HEMT shown in FIG. 3B.
Figure 4B:
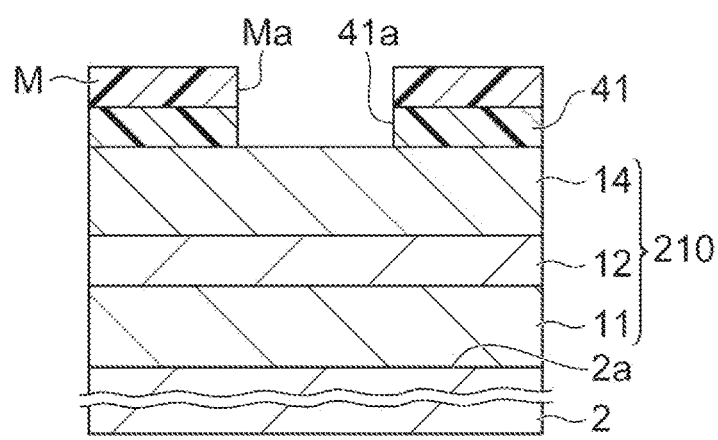

Unlike the HEMT 1 according to the present embodiment, these HEMT 100 and 200 do not include the AlN layer 13 functioning as the etching stop layer. Here, the problem common to the HEMT 100 and 200 that do not include the AlN layer 13 is described below with the HEMT 200 as a representative. FIGS. 4A, 4B, 4C and 4D are diagrams for explaining the problems of the HEMT 200, and show the respective manufacturing steps of the HEMT 200. When the HEMT 200 is manufactured, first, as shown in FIG. 4A, the buffer layer 11, the AlGaN barrier layer 12, and the GaN channel layer 14 are grown sequentially on the surface 2a of the substrate 2. The layers 11, 12, and 14 constitute a semiconductor stack 210. The SiN layer 41 and the mask M are formed on the semiconductor stack 210. Next, as shown in FIG. 4B, the opening 41a in the SiN layer 41 is formed using the mask M.

Figure 4C:
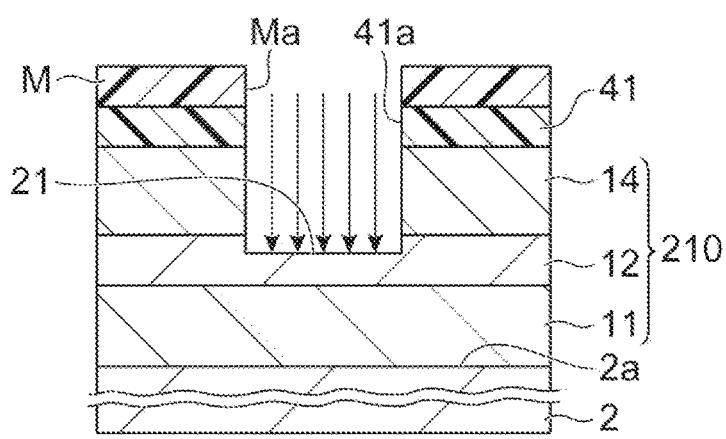
Figure 4D:
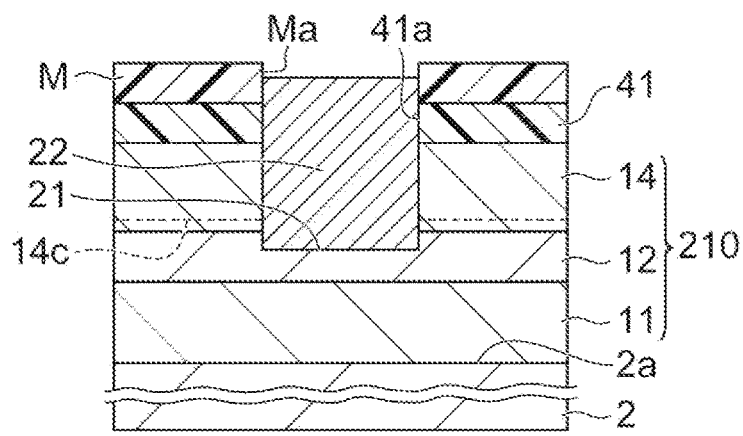

Subsequently, as shown in FIG. 4C, recesses 21 in the semiconductor stack 210 are formed by etching through the opening Ma of the mask M. This etching is dry etching, in one example, RIE. The etching gas is, for example, a chlorine-based gas. The etching is performed in a furnace for etching. Next, transferring the HEMT 200 from the furnace for etching to the growth furnace, as shown in FIG. 4D, the GaN regions 22 in the recesses 21 are regrown. When the HEMT 200 in the process of manufacturing is transferred to the growth furnace, the semiconductor stack exposed through the recesses 21, that is, the inner surfaces of the recesses 21 are oxidized and contaminated by exposure to the air. Therefore, before the regrowth of the GaN regions 22 in the recesses 21, an oxide film and contamination generated on the inner surfaces of the recesses 21 are removed using, for example, HF (hydrofluoric acid aqueous solution). Thereafter, through the same manufacturing process as that of the HEMT 1, the HEMT 200 shown in FIG. 3B is produced.

In the manufacturing process of the HEMT 200 described above, in the step of forming the recesses 21 by etching, the recesses 21 are formed by RIE using chlorine-based gas as described above. However, the etching selectivity between the AlGaN barrier layer 12 and the GaN channel layer 14 to chlorine plasma is insufficient, so that the etching depth (the depth of the recesses 21) tends to vary. The recesses 21 may reach the AlGaN barrier layer 12 as illustrated in FIG. 4C, and the recesses 21 may not reach the AlGaN barrier layer 12. Thus the etching depth varies, variations in the access resistance between the ohmic electrode on each GaN region 22 and the channel region 14c occurs.

Figure 5:
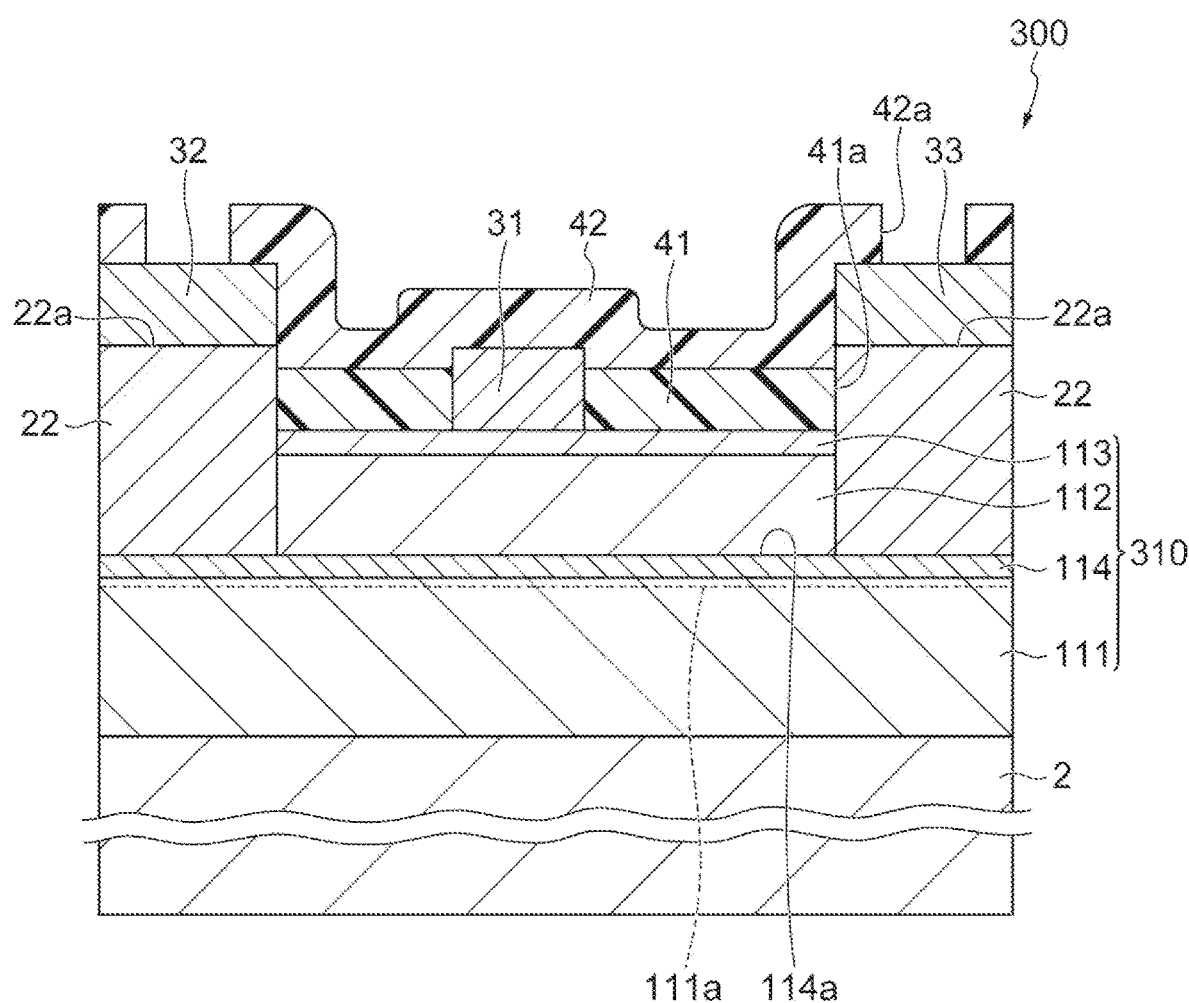
FIG. 5 is a cross-sectional view showing a configuration of a HEMT according to a third comparative embodiment.

To reduce variations in the etching depth, a structure in which an AlN layer is interposed in the semiconductor stack as the etching stop layer is considered. FIG. 5 is a cross-sectional view showing the configuration of a HEMT 300 according to the third comparative example. The HEMT 300 according to the third comparative example has a structure in which an AlN layer 114 is interposed in the HEMT 100 according to the first comparative example. As shown in FIG. 5, a semiconductor stack 310 of the HEMT 300 has the AlN layer 114 between the GaN channel layer 111 and the AlGaN barrier layer 112. According to the structure of the HEMT 300, it is considered that the etching selectivity between the AlN layer 114 and the AlGaN barrier layer 112 with respect to the chlorine plasma can be sufficiently ensured, so that the etching depth can be stabilized to the depth of the AlN layer 114.

However, in the structure of the HEMT 300, the AlN layer 114 may not function as the etching stop layer. When the semiconductor stack 310 of the HEMT 300 is formed, the GaN channel layer 111, the AlN layer 114, and the cap layer 113 are grown on the surface 2a of the substrate 2 in this order. At this time, the AlN layer 114 is preferably grown at a higher temperature, for example, 1200° C., than a temperature at which the GaN channel layer 111 under the AlN layer 114 is grown. However, the thermal resistance of the GaN channel layer 111 is lower than that of the AlN layer 114. Further, since the HEMT 300 has a normal HEMT configuration, each layer of the semiconductor stack 310 is grown on Ga-face having low thermal resistance. Therefore, when the growth furnace is set to such a high temperature, the Ga-face of the GaN channel layer 111 cannot withstand the high temperature and is easily pyrolyzed. When the Ga-face of the GaN channel layer 111 is thermally decomposed, the AlN layer 114 is converted into an AlGaN layer, and there is a possibility that the AlN layer 114 can not function as the etching stop layer.

Further, in the structure of the HEMT 300, the surface 114a of the AlN layer 114 is exposed through the recesses 21 during RIE. Nitrogen (N) atoms of the AlN layer 114 are desorbed from the surface 114a. This desorption of N atoms may reduce the crystallinity of the GaN regions 22 grown in the recesses 21. When the crystallinity of the GaN regions 22 decreases, there is a concern that the contact resistance between the surface 22a of each GaN region 22 and each ohmic electrode increases, and the access resistance between the channel region 111a and each ohmic electrode increases.

In order to solve the above problems, the HEMT 1 according to the present embodiment has a structure of an inverted HEMT having the AlN layer 13 as the etching stop layer as shown in FIG. 1. In the HEMT 1 having an inverted HEMT structure, the GaN channel layer 14 is provided on the AlGaN barrier layer 12 via the AlN layer 13. The AlGaN barrier layer 12 below the AlN layer 13 has a higher thermal resistance than the GaN channel layer 14. Therefore, even if the temperature in the growth furnace for growing the semiconductor stack 10 is high, the AlGaN barrier layer 12 is less likely to be thermally decomposed as compared with the GaN channel layer 14. Furthermore, in the HEMT 1 having the structure of the inverted HEMT, the growing surface of each layer of the semiconductor stack 10 becomes an N-face having a higher thermal resistance than the Ga-face. Therefore, according to the HEMT 1, the thermal decomposition of the AlGaN barrier layer 12 below the AlN layer 13 can be suppressed, and the AlN layer 13 can be prevented from being converted into an AlGaN layer. That is, the AlN layer 13 can function as the etching stop layer more reliably.

Then, etching to form the recesses 21 is performed in an atmosphere containing $H_2$. When this atmosphere is set to a temperature of 900° C. or higher, the etching on the semiconductor stack 10 by $H_2$ progresses, and the recesses 21 reaching the AlN layer 13 through the GaN channel layer 14 from the surface 10a of the semiconductor stack 10 is formed in the semiconductor stack 10. Since the AlN layer 13 has a high etching resistance as compared with the GaN channel layer 14, it is possible to sufficiently ensure the etching selectivity between the AlN layer 13 and the GaN channel layer 14. Therefore, the AlN layer 13 can be utilized as the etching stop layer, and it is possible to stabilize the etching depth (i.e., the depth of the recesses 21) to the depth of the AlN layer 13. As a result, variations in the access resistance between each ohmic electrode formed on each GaN region 22 and the channel region 14c can be reduced.

Figure 6A:
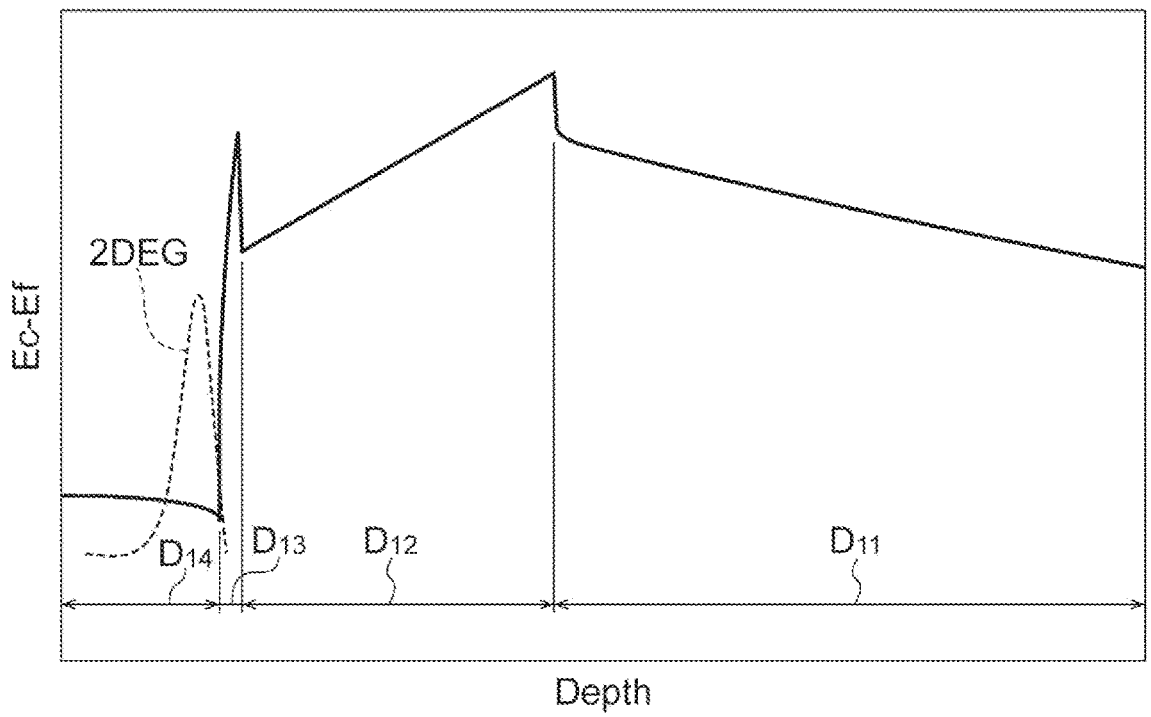
FIG. 6A is a band diagram in a portion immediately below the gate electrode of the HEMT.
Figure 6B:
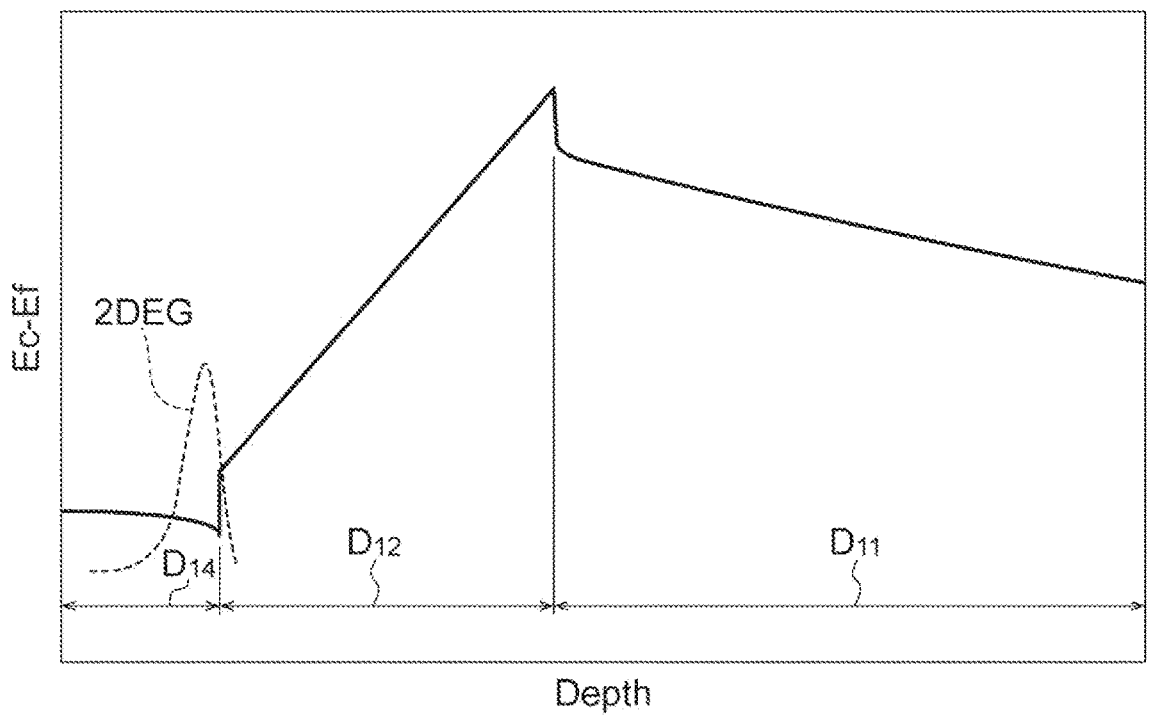
FIG. 6B is a band diagram in a portion immediately below the gate electrode of a HEMT without the AlN layer.

Here, referring to FIGS. 6A and 6B, the function of the AlN layer 13 in the HEMT 1 as a device is described. FIG. 6A schematically shows the difference from the Fermi level of the conduction-band energy (band diagram) in the portion immediately below the gate electrode 31 of the HEMT 1. FIG. 6B schematically shows a band diagram in a portion immediately below the gate electrode 31 of the HEMT 1 without the AlN layer 13. In FIGS. 6A and 6B, the horizontal axis shows the depth from the surface 10a of the semiconductor stack 10, and the vertical axis shows the difference between the lower end level Ec of the conduction band and the Fermi level Ef. The ranges D11, D12, D13, and D14 in FIGS. 6A and 6B represent the existence ranges of the buffer layer 11, the AlGaN barrier layer 12, the AlN layer 13, and the GaN channel layer 14, respectively. Further, in FIG. 6A and FIG. 6B, the distribution of 2DEG generated in the GaN channel layer 14 is shown together.

Referring to FIG. 6A, it can be seen that in the HEMT 1 including the AlN layer 13 (range D13), bands increase remarkably from the GaN channel layer 14 (range D14) toward the AlN channel layer 13. In the HEMT 1 comprising the AlN layer 13, as compared with the HEMT 1 without the AlN layer 13 (see FIG. 6B), the quantity of 2DEG generated in the GaN channel layer 14 is increased. As a factor for increasing the quantity of 2DEG, for example, the spontaneous polarization of the AlN layer 13 is larger than the spontaneous polarization of the AlGaN barrier layer 12 in the range D12. As another factor, since the lattice constant difference between the AlN layer 13 and the GaN channel layer 14 is larger than the lattice constant difference between the AlGaN barrier layer 12 and the GaN channel layer 14, the piezoelectric polarization of the AlN layer 13 is greater than the piezoelectric polarization of the AlGaN barrier layer 12. Furthermore, since the HEMT 1 comprises the AlN layer 13, the height of the barrier (energy) between the GaN channel layer 14 and the AlGaN barrier layer 12 is increased, so that it is possible to suppress the leaching of 2DEG into the AlGaN barrier layer 12. In the AlGaN barrier layer 12, since the two Group III atoms of Al and Ga are present in the crystal, alloy scattering is likely to occur due to the structure of the crystal not being uniform. In contrast, in the AlN layer 13, such alloy scattering does not occur. Therefore, the AlN layer 13 is provided on the AlGaN barrier layer 12, and further, the seep of 2DEG to the AlGaN barrier layer 12 is suppressed as described above, so that 2DEG is less susceptible to alloy scattering by the AlGaN barrier layer 12. This improves the mobility of 2DEG. Since such a function can be expected, the AlN layer 13 can also be referred to as a stopper layer.

Further, as in the present embodiment, after forming the recesses 21 in the semiconductor stack 10 by etching through the openings Ma of the mask M, the GaN regions 22 may be grown in the recesses 21 through the openings Ma of the mask M. Thus, it is possible to form both of the recesses 21 by etching and the growth of the GaN regions 22 in the recesses 21 using the same mask M. Therefore it is possible to simplify the manufacturing process of the HEMT 1. Further, if a mask for the formation of the recesses 21 by etching is different from a mask for the growth of the GaN regions 22 in the recesses 21, a positional deviation between these masks with respect to the recesses 21 can occur. By using the same mask M in these processes, it is possible to avoid the positional deviation. Thus, the GaN regions 22 in the recesses 21 can be grown accurately.

Further, as in the present embodiment, the semiconductor stack 10 may be etched in a mixed atmosphere containing $H_2$ and $NH_3$, and the mixed atmosphere may be set to a temperature of 900° C. or higher. Since $NH_3$ which is easily separated into an N atom and H atoms is contained in a mixed atmosphere, N atoms can be present in the mixed atmosphere. The presence of the N atoms makes it possible to suppress the desorption of the N atoms from the surface 13b of the AlN layer 13 exposed through the recesses 21. As a result, the crystallinity of the surface 13b of the AlN layer 13 can be improved, and the crystallinity of the GaN regions 22 grown on the surface 13b can be improved. As a result, the contact resistance between each ohmic electrode and each GaN region 22 can be reduced. That is, the access resistance between each ohmic electrode and the channel region 14c can be reduced.

Further, as in the present embodiment, the mixed atmosphere in which etching is performed may be set to a temperature of 950° C. or more and 1050° C. or less. By setting the temperature of the mixed atmosphere to 1050° C. or less, it is possible to suppress the acceleration of the desorption of N atoms from the surface 13b of the AlN layer 13 exposed through the recesses 21. Further, by the temperature of the mixed atmosphere is set to 950° C. or higher, it is possible to suppress a decrease in the rate of etching by $H_2$.

Further, as in the present embodiment, in the process of forming the recesses 21 by etching, the ratio F2/F1 of the flow rate F2 of $NH_3$ to the flow rate F1 of $H_2$ in the mixed atmosphere may be 0.8 or more and 1.2 or less. Thus, while suppressing the desorption of N atoms from the surface 13b of the AlN layer 13, it is possible to sufficiently obtain the rate of etching by $H_2$.

Further, as in the present embodiment, the process of forming the recesses 21 by etching and the step of growing the GaN regions 22 in the recesses 21 may be performed continuously in the same growth furnace. This etching, as described above, not limited to the furnace for etching, can also be performed in the growth furnace for growth of the semiconductor stack 10. Therefore, the process of forming the recesses 21 by etching and the step of growing the GaN regions 22 in the recesses 21 can be performed continuously in the same growth furnace. That is, it is possible to grow the GaN regions 22 in the recesses 21 after forming the recesses 21 in the semiconductor stack 10, without taking the HEMT 1 out of the furnace during the manufacturing processes. The semiconductor stack 10 exposed through the recesses 21, i.e. the inner surfaces of the recesses 21, can not be exposed to the atmosphere. Thus, on the inner surface of the recesses 21, oxidation and contamination due to exposure to the atmosphere can be reduced. As the result, a step of removing the oxide film and contamination which may be formed on the inner surfaces of the recesses 21 becomes unnecessary, and it is possible to simplify the manufacturing process of the HEMT 1.

Further, as in the present embodiment, in the process of growing the GaN regions 22 in the recesses 21, the GaN regions 22 may be doped with an n-type impurity. As the result, an increase in the access resistance between each ohmic electrode formed on each GaN region 22 and the channel region 14c can be reduced.

Since the HEMT 1 according to the present embodiment has the structure of the inverted HEMT as described above, the AlN layer 13 is hardly converted into the AlGaN layer, and the AlN layer 13 is possible to more reliably function as the etching stop layer. Then, since the AlN layer 13 can be utilized as the etching stop layer when the recesses 21 are formed by etching, it is possible to stabilize the etching depth (i.e., the depth of the recesses 21) to the depth of the AlN layer 13. As a result, variations in the access resistance between each ohmic electrode provided on each GaN region 22 and the channel region 14c can be reduced.

Further, as in the present embodiment, the surface 12b of the AlGaN barrier layer 12, the surface 13b of the AlN layer 13, and the surface 14b of the GaN channel layer 14 may be N-face. As a result, each layer can be grown on N-face, and the GaN channel layer 14 can be formed on the AlGaN barrier layer 12 in the inverted HEMT. Further, as described above, since the N-face is less likely to be thermally decomposed than the Ga-face, it is possible to further suppress a conversion of the AlN layer 13 into the AlGaN layer by thermal decomposition of the AlGaN barrier layer 12. Thus, the AlN layer 13 is possible to more reliably function as the etching stop layer. As the result, variation in access resistance between each ohmic electrode and the channel region 14c can be reduced more reliably.

The semiconductor device and the method of manufacturing the semiconductor device according to the present disclosure are not limited to the embodiments described above, and various other modifications are possible. For example, in the above-described embodiment, the mixing atmosphere for etching the recesses may include other raw materials in addition to $H_2$ and $NH_3$. Further, a step of forming recesses by etching and a step of growing GaN regions in the recesses may be performed respectively in different furnaces from each other. The mask used in the process of growing the GaN regions in the recesses may be different from the mask used in the step of forming the recesses by etching. In the above embodiment, the present disclosure is applied to a HEMT. However, the present disclosure may be applied to transistors other than HEMT, and may be applied to semiconductor devices other than transistors (in particular, nitride semiconductor devices).

What is claimed is:

1. A semiconductor device comprising:
a substrate;
an AlGaN layer or an InAlN layer provided on the substrate, the AlGaN layer or the InAlN layer being n-type doped or undoped;
an AlN layer formed on an upper surface of the AlGaN layer or an upper surface of the InAlN layer;
a GaN layer formed on an upper surface of the AlN layer, the GaN layer including a two-dimensional electron gas;
a pair of GaN regions provided on the AlN layer, the GaN regions sandwiching a portion of the GaN layer and being formed on the upper surface of the AlN layer, the pair of GaN regions being n-type doped;
a pair of ohmic electrodes provided on the pair of GaN regions, each ohmic electrode making ohmic contact with one of the GaN regions; and
a gate electrode formed between the pair of ohmic electrodes on an upper surface of the GaN layer,
wherein each GaN region has a thickness greater than a thickness of the GaN layer, and each GaN region protrudes from the upper surface of the GaN layer.

2. The device according to claim 1, wherein each upper surface of the AlGaN layer or the InAlN layer, the AlN layer, and the GaN layer, which is opposite to the substrate, is an N-polar surface.

3. A semiconductor device comprising:
a substrate;
a barrier layer provided on the substrate, the barrier layer being n-type doped or undoped;
a stopper layer formed on an upper surface of the barrier layer;
a channel layer formed on an upper surface of the stopper layer, the channel layer including a two-dimensional electron gas;
a source region and a drain region which are adjacent to the channel layer, and sandwich a portion of the channel layer, the source region and the drain region being n-type doped;
a source electrode and a drain electrode respectively provided on the source region and the drain region; and
a gate electrode provided between the source electrode and the drain electrode,
wherein the barrier layer is an AlGaN layer or an InAlN layer, the stopper layer is an AlN layer, the channel layer is a GaN layer, and the source region and the drain region are GaN regions,
wherein the channel layer and the source region and the drain region are formed on the upper surface of the stopper layer,
wherein the source region has a thickness greater than a thickness of the channel layer and the source region protrudes from a surface of the channel layer, and
wherein the drain region has a thickness greater than the thickness of the channel layer and the drain region protrudes from the surface of the channel layer.

* * * * *